(12) United States Patent
Saimen

(10) Patent No.: US 8,289,492 B2
(45) Date of Patent: Oct. 16, 2012

(54) ELECTRO-OPTICAL DEVICE AND ELECTRONIC APPARATUS

(75) Inventor: Munehide Saimen, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 161 days.

(21) Appl. No.: 12/947,032

(22) Filed: Nov. 16, 2010

(65) Prior Publication Data

US 2011/0122356 A1 May 26, 2011

(30) Foreign Application Priority Data

Nov. 24, 2009 (JP) ................. 2009-265996

(51) Int. Cl.
*G02F 1/1345* (2006.01)

(52) U.S. Cl. ........ 349/152; 349/149; 349/150; 349/151; 349/187

(58) Field of Classification Search .................. None
See application file for complete search history.

(56) References Cited

FOREIGN PATENT DOCUMENTS

JP 2000242194 A 9/2000

*Primary Examiner* — Phu Vu

(74) *Attorney, Agent, or Firm* — Lowe, Hauptman, Ham & Berner, LLP

(57) ABSTRACT

An electro-optical device includes an electro-optical panel including a pair of first panel alignment marks having a first shape and a pair of second panel alignment marks having a second shape; a first circuit substrate provided with a first circuit substrate alignment mark which is represented by the first shape in plan view; and a second circuit substrate provided with a second circuit substrate alignment mark which is represented by the second shape in plan view.

8 Claims, 13 Drawing Sheets

ELECTRO-OPTICAL DEVICE AND ELECTRONIC APPARATUS

BACKGROUND

1. Technical Field

The present invention relates to an electro-optical device and an electronic apparatus.

2. Related Art

As one of an electro-optical device, a liquid crystal device is configured to have a liquid crystal panel with a display region, and a relay substrate for transmitting a signals to the liquid crystal panel between the liquid crystal panel and an external driving circuit. As a representative method for electrically connecting the liquid crystal panel and the relay substrate, Japanese Patent No. 3549760 discloses an electrical connection method for connecting a conductive particle constituting an anisotropic conductive film (ACF) and connection terminals by providing connection terminals to both of flexible printed circuits (FPC) as a liquid crystal panel and a relay substrate, and pressing these via the anisotropic conductive film. Also, Japanese Patent No. 3549760 discloses a method for electrically connecting a plurality of flexible substrates to one liquid crystal panel.

However, there is a problem that the liquid crystal device becomes inoperable if the connection positions in each of the flexible substrates are incorrectly mounted to the liquid crystal panel when the wiring in the plurality of flexible substrates or the like are different respectively.

SUMMARY

An advantage of some aspects of the invention can be realized as the following aspects or applications.

Application 1

An electro-optical device according to this application of the invention includes an electro-optical panel provided with at least a first terminal portion and a second terminal portion on which a plurality of terminals are arranged in a predetermined direction; a first circuit substrate provided with a first connection terminal portion electrically connected to the first terminal portion; and a second circuit substrate provided with a second connection terminal portion electrically connected to the second terminal portion, wherein a pair of first panel alignment marks and a pair of second panel alignment marks are provided in the electro-optical panel, the pair of first panel alignment marks have a first shape provided in both end sides for the predetermined direction of the first terminal portion, the pair of second panel alignment marks have a second shape provided in both end sides for the predetermined direction of the second terminal portion, the second shape is different from the first shape in a direction of characteristic portion thereof or is different from the first shape in a shape thereof, the first circuit substrate is provided with a first circuit substrate alignment mark which is represented by the first shape in plan view, which is not overlapped each other upon superimposing the first panel alignment mark in a reference position, and which is set as a predetermined shape in a shape upon incorporating, and the second circuit substrate is provided with a second circuit substrate alignment mark which is represented by the second shape in plan view, which is not overlapped each other upon superimposing the second panel alignment mark in a reference position, and which is set as the a predetermined shape in a shape upon incorporation.

According to the configuration of the invention, it is possible to align the shapes of each of the alignment marks since the first circuit substrate alignment mark is formed to be represented by the first shape of the first panel alignment mark. Meanwhile, it is possible to align the shapes of each of the alignment marks since the second circuit substrate alignment mark is formed to be represented by the second shape of the second panel alignment mark. That is, the first panel alignment mark with the first shape and the second circuit substrate alignment mark formed to be represented by the second shape have shapes not aligned with each other. Therefore, it is possible to align and connect the positions of the first terminal portion and the first connection terminal portion, and the positions of the second terminal portion and the second connection terminal portion with each other. As a result, it is possible to electrically connect to the electro-optical panel with no misalignment in the positions of a plurality of circuit substrates.

Application 2

In the electro-optical device according to the above application, it is preferable that the direction of the characteristic portion indicates a relative arrangement relationship of the first terminal portion and the second terminal portion with respect to the electro-optical panel.

According to the configuration of the invention, the characteristic portion is provided in a direction corresponding to the position where the first terminal portion and the second terminal portion are arranged, that is, the position where the flexible substrate is bonded to the electro-optical panel, so that the mispositioning of the bending position errors can be prevented upon bonding the plurality of flexible substrates.

Application 3

In the electro-optical device according to the above application, it is preferable that the shape of the characteristic portion is a convex shape or a concave shape.

According to the configuration of the invention, since the shape of the characteristic portion is a convex shape or a concave shape, it is possible to easily see and prevent the mispositioning of bonding position upon bonding the plurality of flexible substrates to the electro-optical panel.

Application 4

In the electro-optical device according to the above application, it is preferable that a distance between the pair of the first panel alignment marks and a distance between the pair of the second panel alignment marks are substantially equal.

According to the configuration of the invention, since each distance between the alignment marks is substantially equal, the distance of two optical systems (for example, cameras or the like) for recognizing the pair of alignment marks may not be adjusted for each flexible substrate even if the plurality of flexible substrates are bonded to the electro-optical panel. That is, without adjusting the optical systems, it is possible to recognize the shapes of the alignment marks of the plurality of flexible substrates and to improve the detection precision.

Application 5

In the electro-optical device according to the above application, it is preferable that the first circuit substrate alignment mark is represented by the first shape in plan view and is formed to surround the first shape, and the second circuit substrate alignment mark is represented by the second shape in plan view and is formed to surround the second shape.

According to the configuration of the invention, since the first circuit substrate alignment mark and the second circuit substrate alignment mark are formed to surround each shape, it is easy to determine whether or not they align with the first shape or the second shape.

Application 6

In the electro-optical device according to the above application, it is preferable to have a uniform gap over the entire circumferences of the first shape and the second shape upon aligning the first panel alignment mark and the first circuit substrate alignment mark, and the second panel alignment mark and the second circuit substrate alignment mark.

According to the configuration of the invention, when the flexible substrate is bonded and aligned to the electro-optical panel, by having a relationship that results in a uniform gap over the entire circumference of the shape upon aligning the alignment marks to each other, it is possible to define the position relationship of the shapes to each other to improve the position alignment precision of the first panel alignment mark and the first circuit substrate alignment mark.

Application 7

In the electro-optical device according to the above application, it is preferable that an arc shape is included in a part of the first shape and the second shape.

According to the configuration of the invention, since the shape includes the arc shape, it is possible to easily obtain the centroid of the first shape and the second shape, so that the position alignment precision can be improved by the image processing.

Application 8

An electronic apparatus according to this application includes the electro-optical device described above.

According to the configuration of the invention, it is possible to provide an electronic apparatus having high connection reliability in electrical characteristics.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will be described with reference to the drawings in detail. Moreover, the portions of the drawings to be described are enlarged or reduced appropriately where needed for visibility. In the present embodiment, a liquid crystal device of a TFT (Thin Film Transistor) active matrix driving mode is used as a light valve in a liquid crystal projector being a projection-type video device will be described as an example of an electro-optical device.

First Embodiment

Configuration of Liquid Crystal Device

Figure 1:
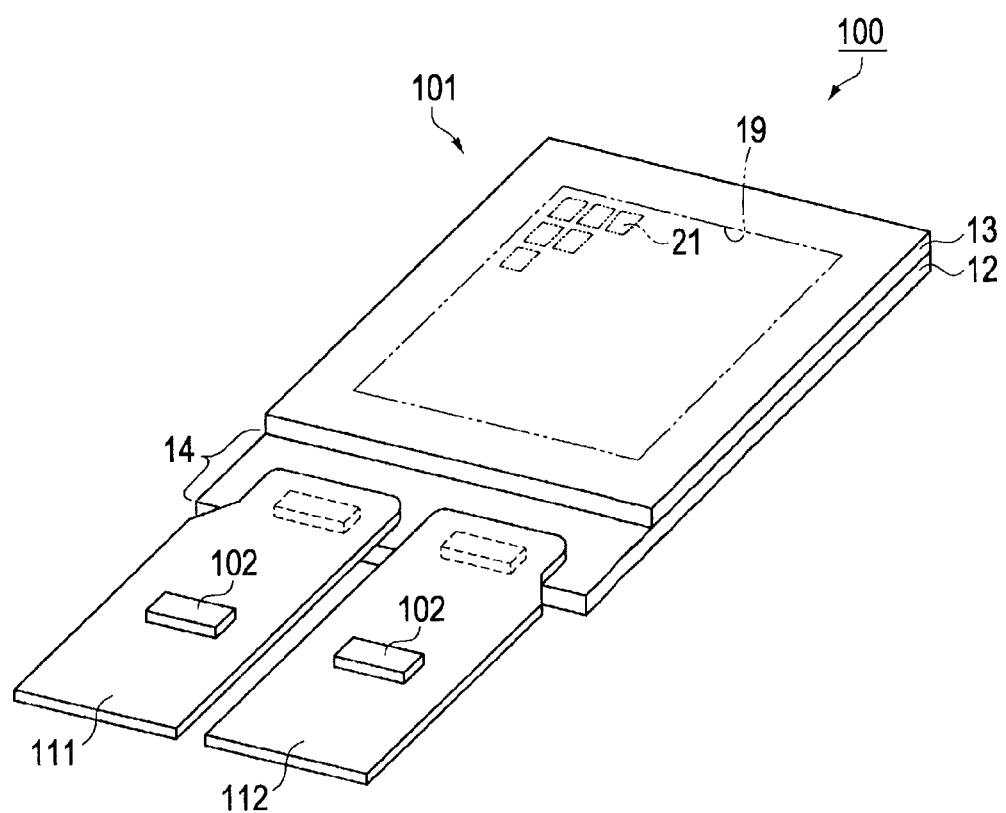
FIG. 1 is a schematic perspective view illustrating the configuration of a liquid crystal device as an electro-optical device.

FIG. 1 is a perspective schematic view illustrating the configuration of a liquid crystal device as an electro-optical device. Hereafter, the configuration of the liquid crystal device will be described with reference to FIG. 1.

As shown in FIG. 1, the liquid crystal device 100 includes a liquid crystal panel 101 as an electro-optical panel, and the flexible substrates 111 and 112 as circuit substrates.

For example, the liquid crystal panel 101 is a liquid crystal panel of a TFT active matrix type using a thin film transistor (hereafter, referred to as TFT element) as a switching element of pixel. In the liquid crystal panel 101, the element substrate 12 and the opposite substrate 13 constituting a pair of substrates are bonded each other via a seal member (not shown) of a substantial rectangular frame-shape in plan view.

The element substrate 12 and the opposite substrate 13 are made of a transparent material such as quartz, or the like for example. The liquid crystal panel 101 has a configuration where the liquid crystal layer 15 (see FIG. 3) is sealed in a region surrounded by the seal member. In addition, a liquid crystal injection port for injecting the liquid crystal is provided in the seal member, and the liquid crystal injection port is sealed by seal member (both not shown).

In the liquid crystal panel 101, a frame light-shielding film (not shown) having the rectangular frame shape in plan view and which is made of light shielding material along the inner periphery of the seal member is formed in the opposite substrate 13, and the region of the inner side of the frame light-shielding film becomes a display region 19.

The display region 19 is provided with the pixel region 21 as a matrix shape. The pixel region 21 forms one pixel which is the minimum display unit of the region 19. In the external connection terminal-forming region 14 which is a region exposed by the element substrate 12, the first flexible substrate 111 (the first circuit substrate) and the second flexible substrate 112 (the second circuit substrate) are bonded to connect with the exterior. The liquid crystal panel 101 and the flexible substrates 111 and 112 will be described in detail later.

The liquid crystal panel 101 is a transmissive type, and a polarizing plate or the like (not shown) is disposed to be used in the incident side and irradiated side of the element substrate 12 and the opposite substrate 13 respectively. In addition, the configuration of the liquid crystal panel 101 is not limited thereto, and may be configured as a reflective type or a semi-transmissive type.

A dust-proof glass (not shown) is bonded to a front and back side of the liquid crystal panel 101. In detail, the dust-proof glass is provided to prevent dust or the like from bonding to at least the display region of the liquid crystal panel 101. These members are bonded to the liquid crystal panel by frames and hooks (neither of which are shown).

Also, for example, a driving IC chip 102 is mounted on the first flexible substrate 111 and the second flexible substrate 112. For example, the driving IC chip 102 is formed including a part of the data line driving circuit which is not shown. Also, the driving IC chip 102 is electrically and mechanically mounted on the wiring substrate using tape automated bonding (TAB) technology. The wiring substrate has a base material having an insulating property such as a polyimide or the like and a pattern-formed wiring on the base material.

Figure 2:
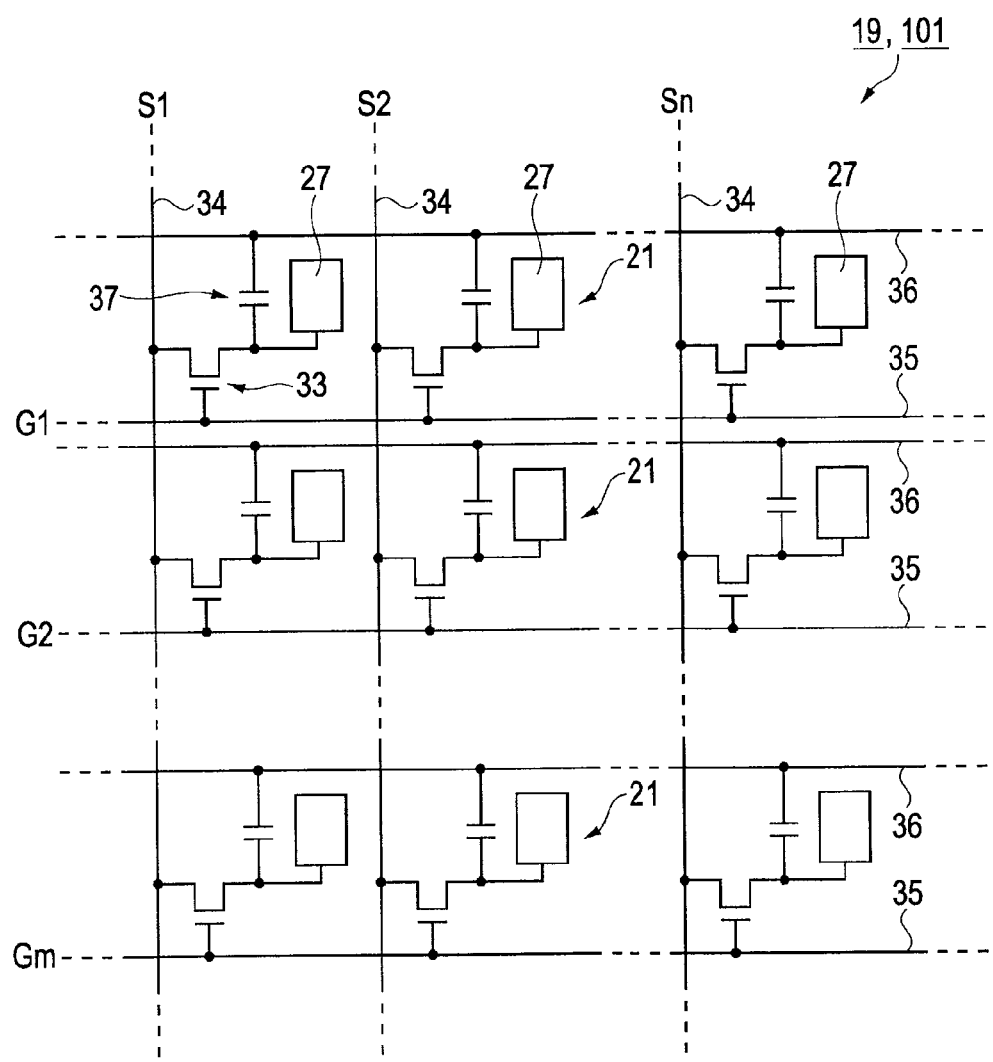
FIG. 2 is an equivalent circuit diagram illustrating the electrical configuration of a liquid crystal panel.

FIG. 2 is an equivalent circuit diagram illustrating the electrical configuration of a liquid crystal panel. Hereafter, the electrical configuration of the liquid crystal panel will be described with reference to FIG. 2.

As shown in FIG. 2, the liquid crystal panel 101 has a plurality of pixel regions 21 constituting a display region 19. Each of the pixel electrodes 27 is disposed in each pixel region 21. Also, TFT elements 33 are formed in the pixel region 21.

The TFT element 33 is a switching element for performing conduction control to the pixel electrodes 27. The data lines 34 are electrically connected to the source side of the TFT elements 33. For example, the data line driving circuit (not shown) supplies image signals S1, S2, ..., Sn to each data line 34.

Also, the scanning lines 35 are electrically connected to the gate sides of the TFT elements 33. For example, the scanning line driving circuit (not shown) supplies scanning signals G1, G2, ..., Gm as pulse signals to the scanning lines 35 at a predetermined timing. Also, the pixel electrodes 27 are electrically connected to the drains side of the TFT elements 33.

The TFT elements 33 as switching elements enter the on-state only during a certain period according to the scanning signals G1, G2, ..., Gm supplied from the scanning lines 35, so that the image signals S1, S2, ..., Sn supplied from the data lines 34 are written to the pixel regions 21 through the pixel electrodes 27 at a predetermined timing.

Figure 3:
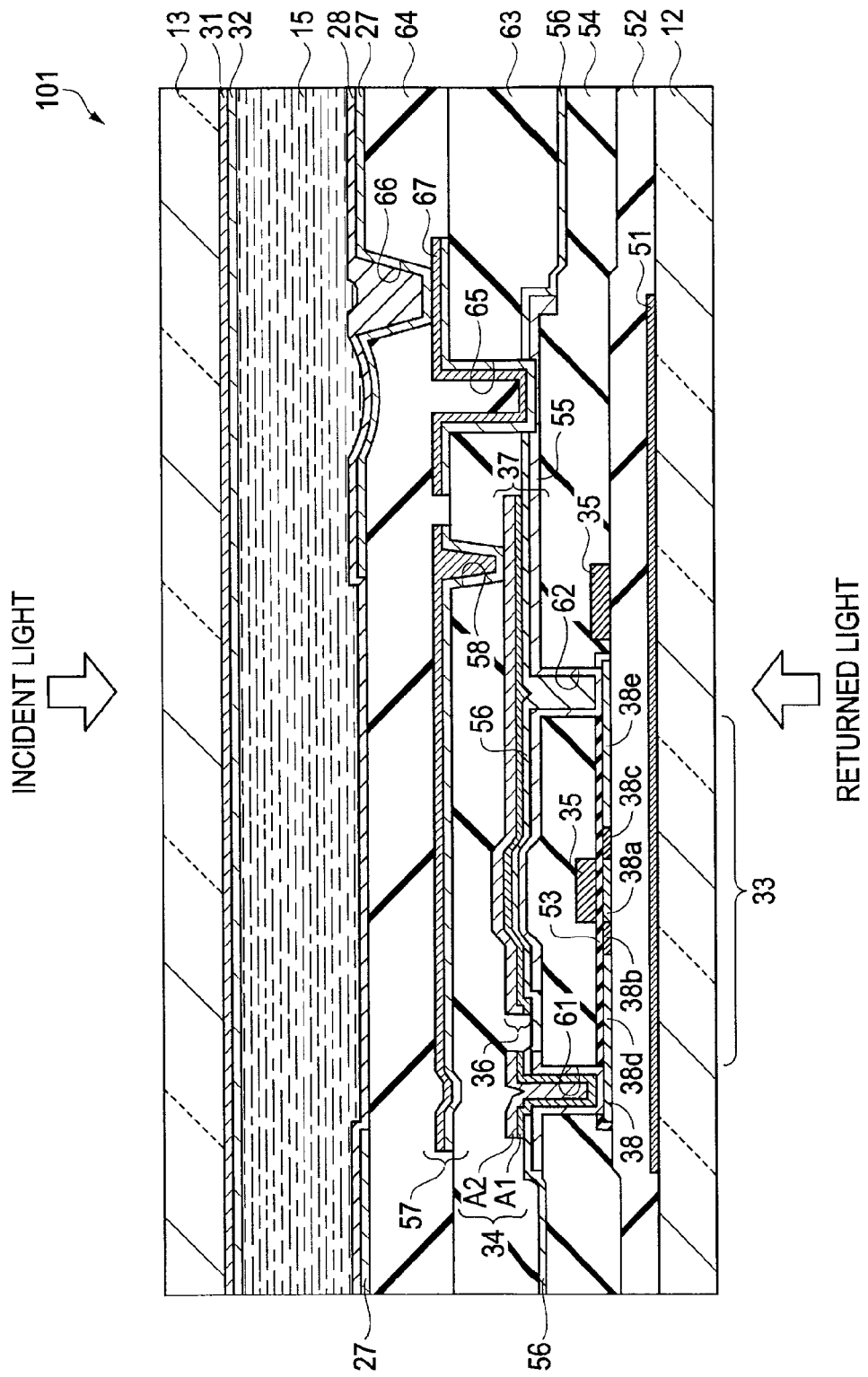
FIG. 3 is a schematic sectional view illustrating the structure of a liquid crystal device.

Image signals S1, S2, ..., Sn written to the pixel regions 21 are held at a predetermined level for a certain period in a liquid crystal capacitor formed between the pixel electrodes 27 and the common electrode 31 (referred to FIG. 3). In addition, a storage capacitor 37 is formed between a pixel-potential side capacitor electrode connected to the pixel electrodes 27 and a capacitor electrode 36 electrically connected to a shield layer 57 (referred to FIG. 3) as one example of a capacitor line in order to prevent the held image signals S1, S2, Sn from being leaked.

As such, if a voltage signal is applied to the liquid crystal layer 15 (referred to FIG. 3), an alignment state of liquid crystal molecules changes depending on the applied voltage level. As a result, the light incident on the liquid crystal layer 15 is adjusted, whereby it becomes possible to generate a image light.

Structure of Liquid Crystal Panel

FIG. 3 is a schematic cross-sectional view illustrating the structure of a liquid crystal device. Hereafter, the structure of the liquid crystal device will be described with reference to FIG. 3. In addition, FIG. 3 illustrates the cross-sectional position relationship of each component, and is expressed in an appropriate size for visibility.

As shown in FIG. 3, the liquid crystal panel 101 includes the element substrate 12 and the opposite substrate 13 disposed opposed thereto. The element substrate 12 and the opposite substrate 13 are configured by the quartz substrate or the like as described above, for example.

The lower light-shielding film 51 made of Ti (Titan) or Cr (Chromium) is formed on the element substrate 12. The lower light-shielding film 51 is patterned into a lattice-shape in plan view, and so defines opening regions of each pixel. The base insulating film 52 made of silicon oxide film or the like is formed on the element substrate 12 and the lower light-shielding film 51.

The TFT element 33 and scanning lines 35 or the like are formed on the base insulating film 52. The TFT element 33 has a lightly doped drain (LDD) structure, for example, so that the semiconductor layer 38 made of polysilicon or the like, the gate insulating film 53 formed on the semiconductor layer 38, and the scanning lines 35 made of polysilicon film or the like formed on the gate insulating film 53 are provided on the base insulating film 52. As described above, the scanning lines 35 function as the gate electrode.

The semiconductor layer 38 includes a channel region 38a, a low concentration source region 38b, a low concentration drain region 38c, a high concentration source region 38d, and a high concentration drain region 38e. The channel region 38a forms channels according to an electric field from the scanning lines 35. The first interlayer insulating film 54 made of silicon oxide film or the like is formed on the base insulating film 52.

The storage capacitor 37 and the data line 34 or the like are provided on the first interlayer insulating film 54. In the storage capacitor 37, a relay layer 55 as the pixel-potential side capacitor electrode connected to the high concentration drain region 38e of TFT element 33 and the pixel electrode 27, and the capacitor electrode 36 as a fixed potential side capacitor electrode are disposed to be faced by interposing a dielectric film 56 therebetween.

The capacitor electrode 36 and the data line 34 are formed as a film having a two-layered structure where a lower layer is the conductive polysilicon film A1 and an upper layer is an aluminum film A2.

The capacitor electrode 36 and the data line 34 contain the aluminum having a relatively superior light-reflecting performance and the polysilicon having a relatively superior light-absorbing performance, so that both can function as light-shielding layer. Therefore, the movement of the incident-light into the semiconductor layer 38 of the TFT element 33 can be blocked on the upper side.

This capacitor electrode 36 functions as a fixed potential side capacitor electrode of the storage capacitor 37. To make the storage capacitor 36 have the fixed potential, as described above, it is electrically connected via the shield layer 57 and the contact hall 58 that have a fixed potential by connecting to a constant potential source excluding the pixel region 21.

The contact hall 61 which electrically connects the high concentration source region 38d of the TFT element 33 and the data lines 34 is opened in the first interlayer insulating film 54. In other words, the data lines 34 are electrically connected to the semiconductor layer 38 of the TFT element 33 by interposing the contact hall 61 which passes through a dielectric film 56 and the first interlayer insulating film 54. Specifically, since the data lines 34 employ the two-layer structure as described above and the relay layer 55 is made of the conductive polysilicon film, the electrical connection between the data lines 34 and the semiconductor layer 38 is realized by the conductive polysilicon film. That is, in order from the bottom, the semiconductor layer 38, the polysilicon film of the relay layer 55, the polysilicon film A1 of lower layer of the data lines 34, the aluminum film A2 of upper layer are formed.

Also, the contact hall 62 which electrically connects the high concentration drain region 38e of the TFT element 33 and the relay layer 55 constituting the storage capacitor 37 is opened in the first interlayer insulating film 54. The second interlayer insulating film 63 made of silicon oxide film or the like is formed on the first interlayer insulating film 54.

For example, the shield layer 57 made of aluminum or the like is formed on the second interlayer insulating 63. Also, the contact hall 58 is formed in the second interlayer insulating film 63 to electrically connect the shield layer 57 and the capacitor electrode 36 as described above. The third interlayer insulating film 64 made of silicon oxide film or the like is formed on the second interlayer insulating film 63.

The contact halls 65 and 66 are opened in the second interlayer insulating film 63 and the third interlayer insulating film 64 in order to electrically connect the pixel electrode 27 and the relay layer 55. Specifically, the contact hall 65 and the contact hall 66 are electrically connected via the second relay layer 67 formed on the second interlayer insulating film 63. The second relay layer 67 has the same film configuration as the shield layer 57, and includes a two-layered structure configured of aluminum film in the lower layer and a titanium nitride film in the upper layer.

That is, the high concentration drain region 38e and the pixel electrode 27 are electrically connected by interposing the contact hall 62, the relay layer 55, the contact hall 65, the second relay layer 67, and the contact hall 66. The pixel electrode 27 and the first orientation film 28 are formed on the third interlayer insulating film 64.

The pixel electrode 27 is formed in a matrix shape in plan view and, for example, is comprised of a transparent conductive film such as ITO film or the like. Also, the first orientation film 28 which performs an orientation process in a predetermined direction by means of rubbing is formed on the pixel electrode 27. The first orientation film 28 is formed of for example, a transparent organic film such as polyimide or the like.

The liquid crystal layer 15 sealed by the electro-optical material such as a liquid crystal in a space surrounded by the seal member is provided on the first orientation film 28. The second orientation film 32 on which an orientation process is performed in a predetermined direction by means of covering the transparent common electrode 31 and rubbing is formed in a side facing the liquid crystal 15 of the opposite substrate 13. The second orientation film 32 is formed of for example, a transparent organic film such as polyimide or the like.

The liquid crystal layer 15 has a predetermined orientation state according to the first orientation film 28 and the second orientation film 32 in a state where an electric field from the pixel electrode 27 is not applied. Seal member is an adhesive agent made of photo-curable resin or thermosetting resin for example, for bonding the element substrate 12 and the opposite substrate 13 respectively in the vicinity thereof, and has a spacer such as glass fiber or glass beads mixed therein to make the distance between both substrates a predetermined value.

Figure 4:
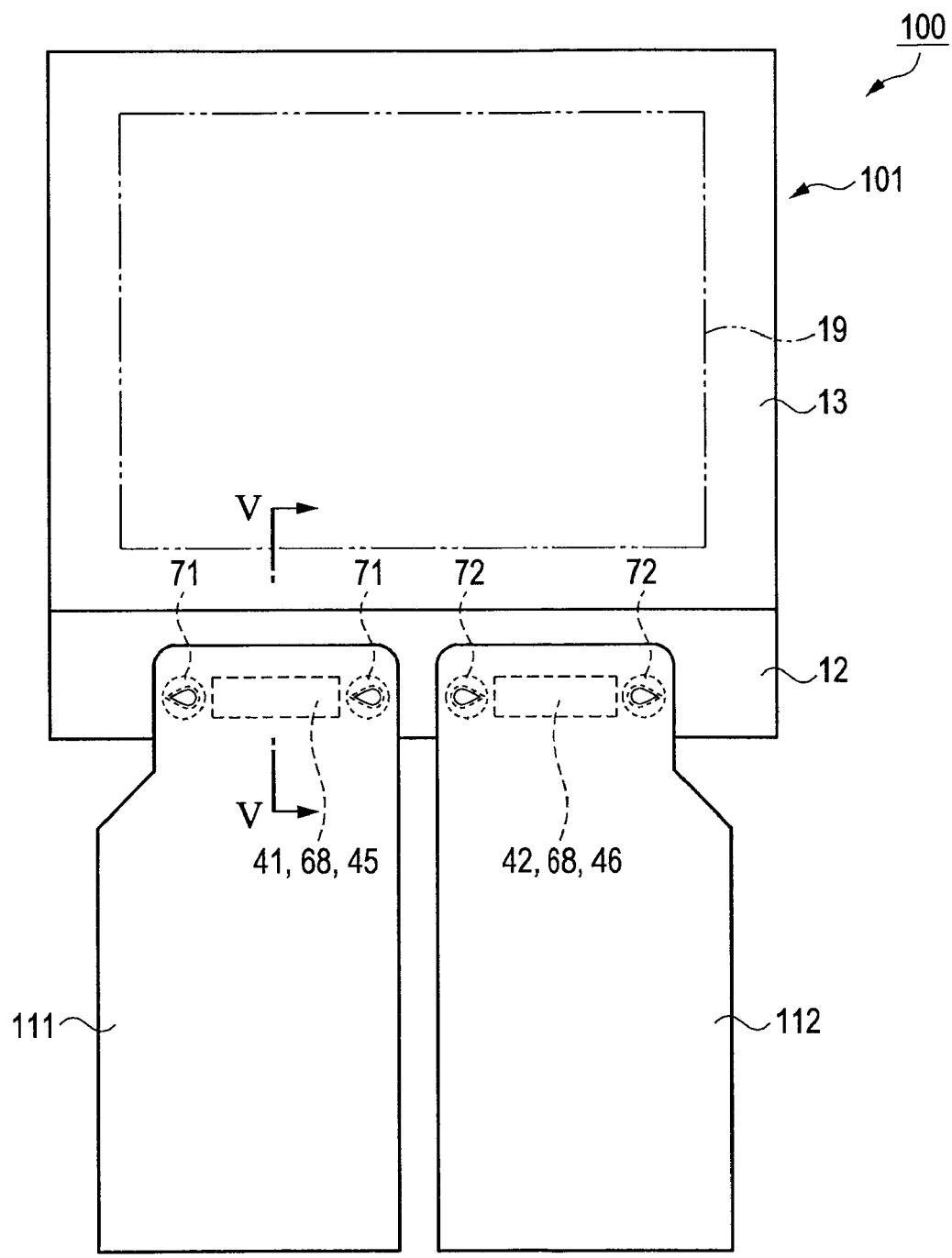
FIG. 4 is a schematic plan view illustrating the connection state of the liquid crystal panel and a circuit substrate according to the first embodiment.
Figure 5:
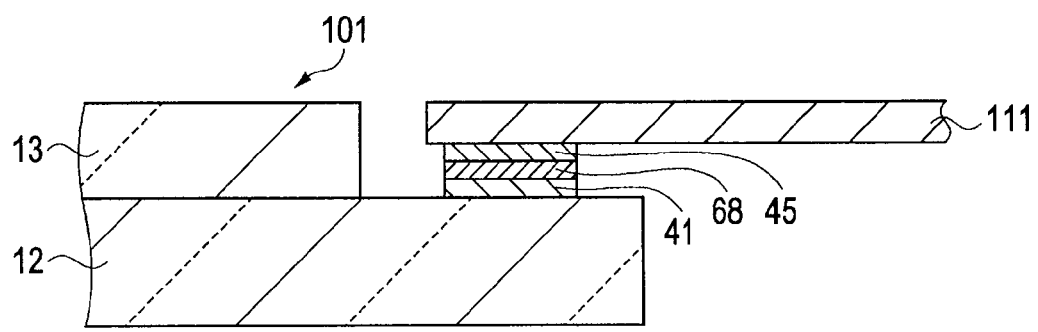
FIG. 5 is a schematic cross-sectional view taken along the line V-V of the liquid crystal device shown in FIG. 4.

FIG. 4 is a schematic plan view illustrating the connection state of the liquid crystal panel and a flexible substrate in the liquid crystal device according to the first embodiment. FIG. 5 is a schematic cross-sectional view taken along the line V-V of the liquid crystal device shown in FIG. 4. Hereafter, the structure of liquid crystal device will be described with reference to FIGS. 4 and 5.

As shown in FIGS. 4 and 5, the liquid crystal device 100 includes the liquid crystal panel 101 provided with the first panel connection terminal portion 41 (the first terminal portion) and the second panel connection terminal portion 42 (the second terminal portion) having a plurality of terminals; the first flexible substrate 111 provided with the first FPC connection terminal portion 45 (the first connection terminal portion) having a plurality of terminals connected to the first panel connection terminal portion 41; and the second flexible substrate 112 provided with the second FPC connection terminal portion 46 (the second connection terminal portion) having a plurality of terminals connected to the second panel connection terminal portion 42.

The first panel connection terminal portion 41 and the first FPC connection terminal portion 45, and the second panel connection terminal portion 42 and the second FPC connection terminal portion 46 are electrically connected via an anisotropic conductive film (ACF) 68 as an anisotropic conductive film.

The anisotropic conductive films 68 can conduct electricity between each other by being thermocompressed. The anisotropic conductive films 68 contain an insulating adhesive material, and metal particles such as nickel, or gold, silver, copper, aluminum, tin, palladium, ITO, carbon or the like that are spread in the insulating adhesive material. Further, instead of the metal particles, conductive particles in which a metal material is plated in a material such as plastic may be used. Further, in the embodiment, the anisotropic conductive films 68 are used, but a coated film obtained by applying the insulating adhesive material containing the metal particles or the conductive particles may be used.

The first panel connection terminal portion 41 and the first FPC connection terminal portion 45, and the second panel connection terminal portion 42 and the second FPC connection terminal portion 46 are aligned with each other using the alignment marks 71 and 72 formed in the liquid crystal panel 101, the first flexible substrate 111, and the second flexible substrate 112.

Specifically, the liquid crystal panel 101 and the first flexible substrate 111 are positioned and adjusted so that the two alignment marks 71 transmit the liquid crystal panel 101 and the first flexible substrate 111 using for example, the two CCD cameras to align the shape of the alignment marks 71. The second flexible substrate 112 is positioned and adjusted in the same way.

The distance between the two alignment marks 71 and the distance between the two alignment marks 72 are substantially equally formed. Therefore, even though a plurality of flexible substrates 111 and 112 are bonded to the liquid crystal panel 101, it is not necessary to adjust the distance of the two CCD cameras for recognizing the two alignment marks 71 and 71 (72 and 72) for each flexible substrate 111 and 112. That is, without adjusting an optical system (CCD camera), it is possible to recognize the shape of the alignment marks 71 and 72 of the plurality of flexible substrates 111 and 112 to improve the detection precision. Also, in other words, it is possible to suppress the degradation of the position alignment due to adjustment of the optical system. Moreover, it is possible to reduce the number of process of position-adjustment of the optical system. Hereafter, the alignment marks 71 and 72 will be described in detail.

Figure 6:
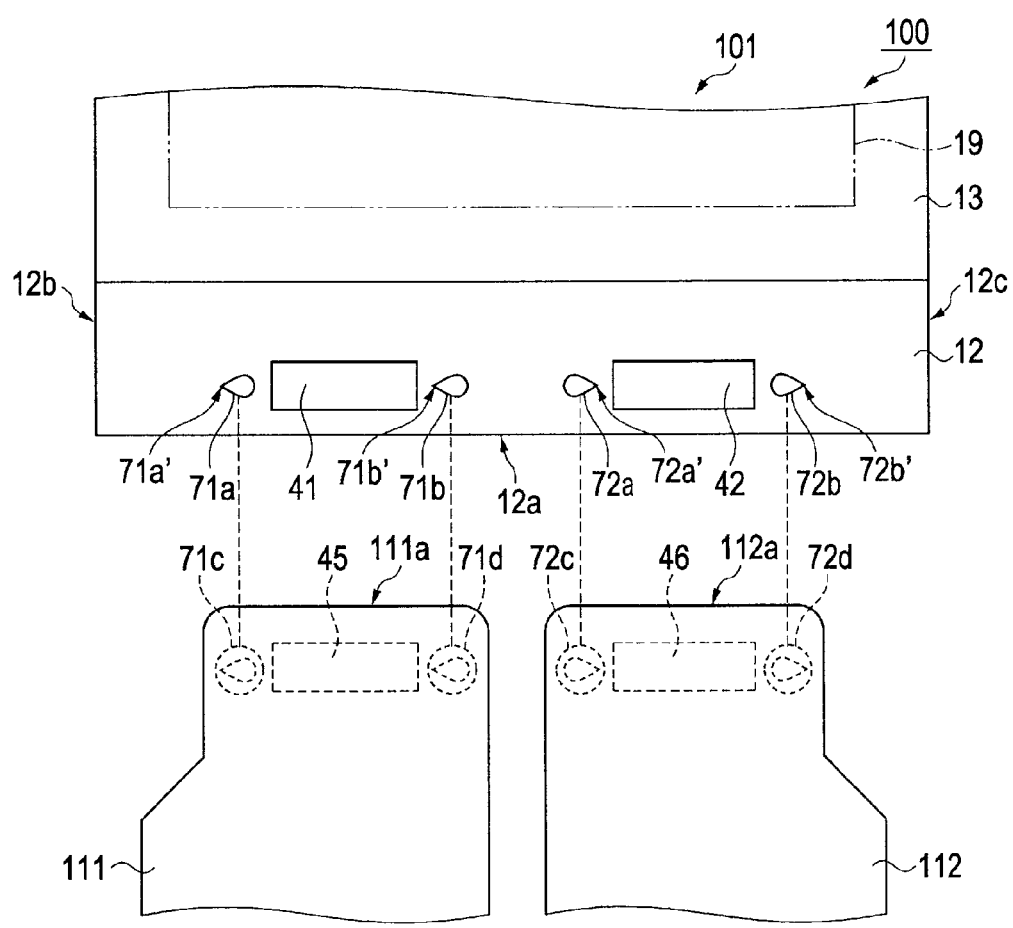
FIG. 6 is a exploded schematic view of a bonding portion of the liquid crystal panel and the circuit substrate.
Figure 7:
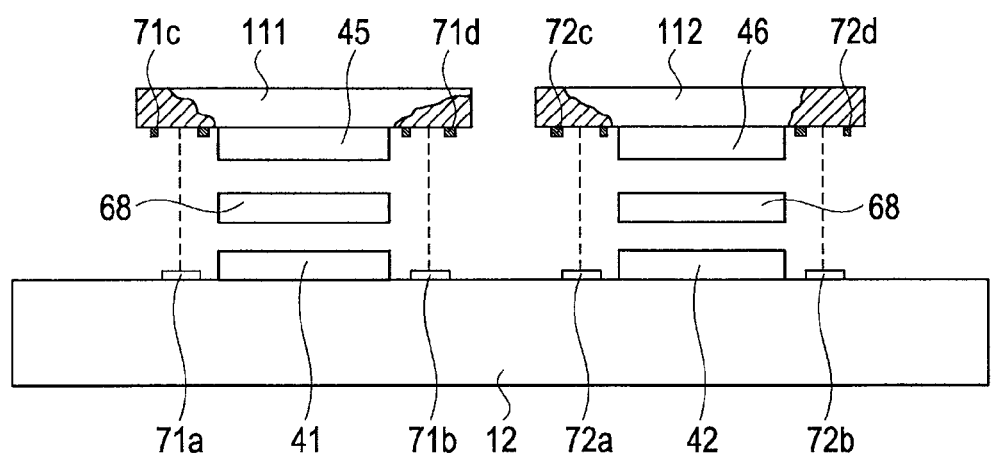
FIG. 7 is a schematic side view illustrating the structure of the liquid crystal device shown in FIG. 6.

FIG. 6 is an exploded schematic view of the bonding portion of the liquid crystal panel and the flexible substrate in the liquid crystal device. FIG. 7 is a schematic side view illustrating the structure of the liquid crystal device shown in FIG. 6. Hereafter, the structure of the liquid crystal device will be described with reference to FIGS. 6 and 7.

As shown in FIGS. 6 and 7, the first panel connection terminal portion 41 and the second panel connection terminal portion 42 are provided in parallel in a first side 12a of the element substrate 12 constituting the liquid crystal panel 101. First panel alignment marks 71a and 71b are provided in both end sides of the first panel connection terminal portion 41.

Also, second panel alignment marks 72a and 72b are provided in both end sides of the second panel connection terminal portion 42.

The first panel alignment marks 71a and 71b and the second panel alignment marks 72a and 72b are formed simultaneously in the same process when a plurality of terminals constitutes the first panel connection terminal portion 41 or the second panel connection terminal portion 42, for example.

Both of the first panel alignment marks 71a and 71b substantially have a fan-shape (or, droplet shape, convex shape) as a first shape, for example. Further, since the first panel connection terminal portion 41 is provided at a second side 12a in the element substrate 12, for example, vertexes 71a' and 71b' substantially having a fan-shape are directed to the direction of second side 12b (which indicates the relative arrangement relationship).

Also, both of the second panel alignment marks 72a and 72b also substantially have a fan-shape as a second shape, for example. Since the second panel connection terminal portion 42 is provided at a third side 12c in the element substrate 12, for example, vertexes 72a' and 72b' substantially having a fan-shape are directed to the direction of third side 12c (which indicates the relative arrangement relationship).

Meanwhile, the first FPC connection terminal portion 45 connected to the first panel connection terminal portion 41 is provided in one end 111a side of the first flexible substrate 111. The first FPC alignment marks 71c and 71d as the first circuit substrate alignment marks are provided in both ends of the first FPC connection terminal portion 45. The first FPC alignment marks 71c and 71d are simultaneously formed in the same process when a plurality of terminals constitutes the first FPC connection terminal portion 45, for example.

Both of the first FPC alignment marks 71c and 71d have shapes which are opened along the shape of the first panel alignment marks 71a and 71b formed on the side of the element substrate 12 in a circular shape. That is, the fan-shapes of the first panel alignment marks 71a and 71b and the opened fan-shapes of the first FPC alignment marks 71c and 71d are aligned. At this time, it is preferable to have relationship that results in a uniform gap over the entire circumference. Thereby, it is possible to define the position relationship of shapes each other to improve the position alignment precision of the first panel alignment marks 71a and 71b and the first FPC alignment marks 71c and 71d, for example.

Also, the second FPC connection terminal portion 46 connected to the second panel connection terminal portion 42 is provided in one end 112a side of the second flexible substrate 112. The second FPC alignment marks 72c and 72d as the second circuit substrate alignment marks are provided in both ends of the second FPC connection terminal portion 46. The second FPC alignment marks 72c and 72d are formed simultaneously in the same process when a plurality of terminals constitutes the second FPC connection terminal portion 46, for example.

Both of the second FPC alignment marks 72c and 72d have shapes which are opened along the shape of the second panel alignment marks 72a and 72b formed on the side of the element substrate 12 in a circular shape. That is, the fan-shapes of the second panel alignment marks 72a and 72b and the opened fan-shapes of the second FPC alignment marks 72c and 72d are aligned.

As such, by making the directions of characteristic portions of the first flexible substrate 111 side and the alignment marks 71 and 72 of the second flexible substrate 112 side different, even though a plurality of the flexible substrates 111 and 112 are bonded to the liquid crystal panel 101, the connection positions of the flexible substrates 111 and 112 can be correctly bonded.

As described above, the below effects can be obtained according to the first embodiment.

(1) According to the first embodiment, since the first FPC alignment marks 71c and 71d are formed along the shapes (substantially fan-shapes) of the first panel alignment marks 71a and 71b, it is possible to align the shapes of each of alignment marks 71a and 71c (71b and 71d). Meanwhile, since the second FPC alignment marks 72c and 72d are formed along the shapes of the second panel alignment marks 72a and 72b, it is possible to align the shapes of each of alignment marks 72a and 72c (72b and 72d). In other words, it is impossible to align the shapes of the first panel alignment marks 71a and 71b and the second FPC alignment marks 72c and 72d. Therefore, the first panel connection terminal portion 41 (42) and the first FPC connection terminal portion 45 (46) can be correctly connected. As a result, it is possible to connect the plurality of flexible substrates 111 and 112 to a normal position of the liquid crystal panel 101.

(2) According to the first embodiment, since the distance of two alignment marks 71 and 71 (72 and 72) is substantially equally formed in the plurality of the flexible substrates 111 and 112, it may not be necessary to adjust the distance of two CCD cameras for recognizing the two alignment marks 71 and 71 (72 and 72) for each the flexible substrates 111 and 112 even though the plurality of the flexible substrates 111 and 112 are bonded to the liquid crystal panel 101. That is, without adjusting the optical system (CCD camera), it is possible to recognize the shapes the alignment marks 71 and 72 formed on a plurality of the flexible substrates 111 and 112 to improve the detection precision.

Second Embodiment

Structure of Liquid Crystal Device

Figure 8:
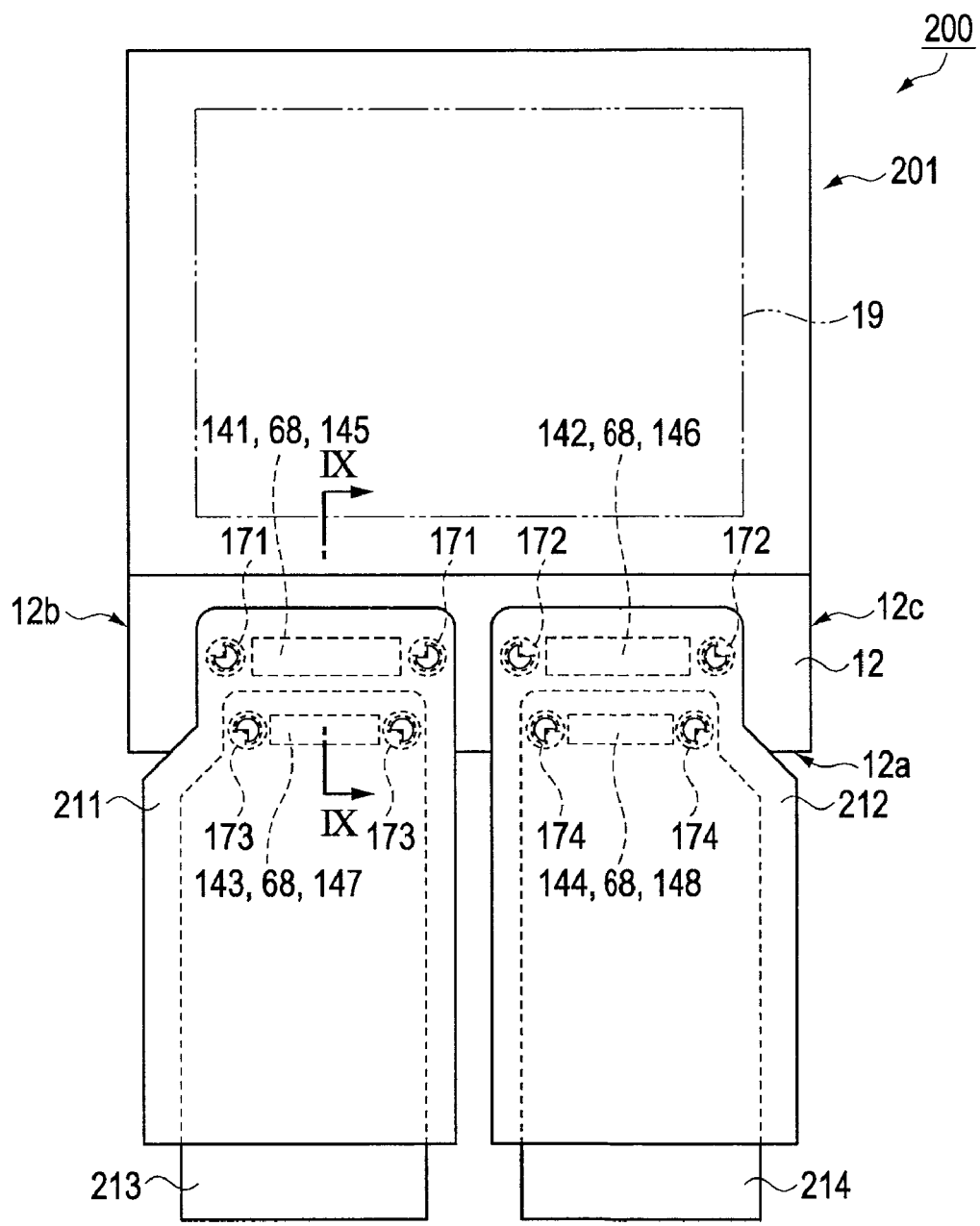
FIG. 8 is a schematic plan view illustrating the connection state of the liquid crystal panel and a circuit substrate according to the second embodiment.
Figure 9:
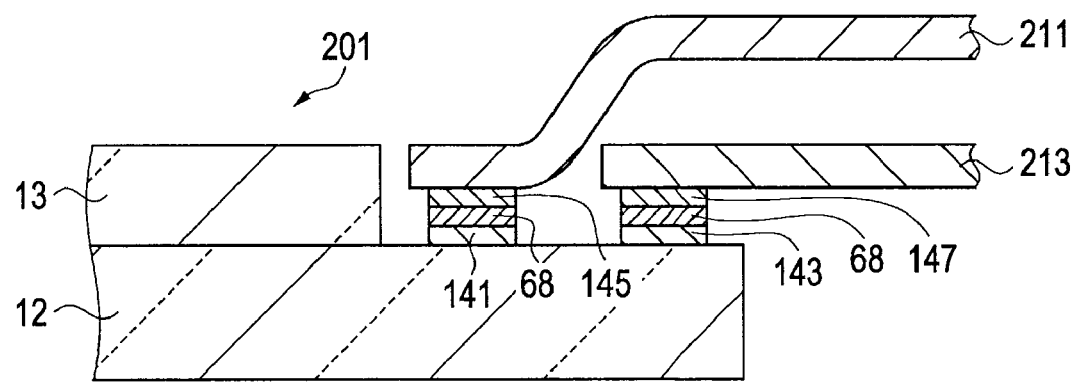
FIG. 9 is a schematic cross-sectional view taken along the line IX-IX of the liquid crystal device shown in FIG. 8.

FIG. 8 is a schematic plan view illustrating the connection state of the liquid crystal panel and a flexible substrate of a liquid crystal device according to the second embodiment. FIG. 9 is a schematic cross-sectional view taken along the line IX-IX of the liquid crystal device shown in FIG. 8. Hereafter, the configuration of the liquid crystal device will be described with reference to FIGS. 8 and 9. In the drawings used, a panel connection terminal portion, a FPC connection terminal portion, and a flexible substrate are shown with a different size in order to make portions to be described recognizable state.

The liquid crystal device 200 according to the second embodiment is different from the first embodiment in that, two flexible substrates are provided vertically over the two steps in the lateral direction in one end side of the liquid crystal panel 201. Hereafter, the same components as those of the liquid crystal device according to the first embodiment are denoted by the same reference numerals, and description thereof will be omitted or simplified.

As shown in FIGS. 8 and 9, the liquid crystal device 200 according to the second embodiment is provided with the first flexible substrate 211 and the second flexible substrate 212 laterally provided in parallel near the display region 19 in the first side 12a of the liquid crystal panel 201. Further, the third flexible substrate 213 and the fourth flexible substrate 214 are laterally provided in parallel in a direction apart from the display region 19 in the first side 12a.

Specifically, the first panel connection terminal portion 141 and the second panel connection terminal portion 142 are provided in parallel to the display region 19 on the element substrate 12. Also, the third panel connection terminal portion 143 and the fourth panel connection terminal portion 144 are provided in parallel in a direction apart from the display region 19.

The first flexible substrate 211 provided with the first FPC connection terminal portion 145 is electrically connected to the first panel connection terminal portion 141 via the anisotropic conductive films 68. The second flexible substrate 212 provided with the second FPC connection terminal portion 146 is electrically connected to the second panel connection terminal portion 142 via the anisotropic conductive films 68. The third flexible substrate 213 provided with the third FPC connection terminal portion 147 is electrically connected to the third panel connection terminal portion 143 via the anisotropic conductive films 68. The fourth flexible substrate 214 provided with the fourth FPC connection terminal portion 148 is electrically connected to the fourth panel connection terminal portion 144 via the anisotropic conductive films 68.

The liquid crystal panel 201 and the first flexible substrates 211 to the fourth flexible substrate 214 perform the position alignment with each other using the alignment marks 171 to 174 provided respectively. Further, the distance between respective two alignment marks 171 and 171 (172 to 174) is substantially equally formed (the drawing is different).

Thus, even when a plurality of the flexible substrate 211 to 214 are bonded to the liquid crystal panel 201, it is not necessary to adjust the distance of the two CCD cameras for recognizing the two alignment marks 171 and 171 (172 to 174) for each flexible substrate 211 to 214. That is, without adjusting the optical system (CCD camera), it is possible to recognize the shape of the alignment marks 171 to 174 of the plurality of the flexible substrates 211 to 214 to improve the detection precision. Hereafter, the alignment marks 171 to 174 will be described in detail.

Figure 10:
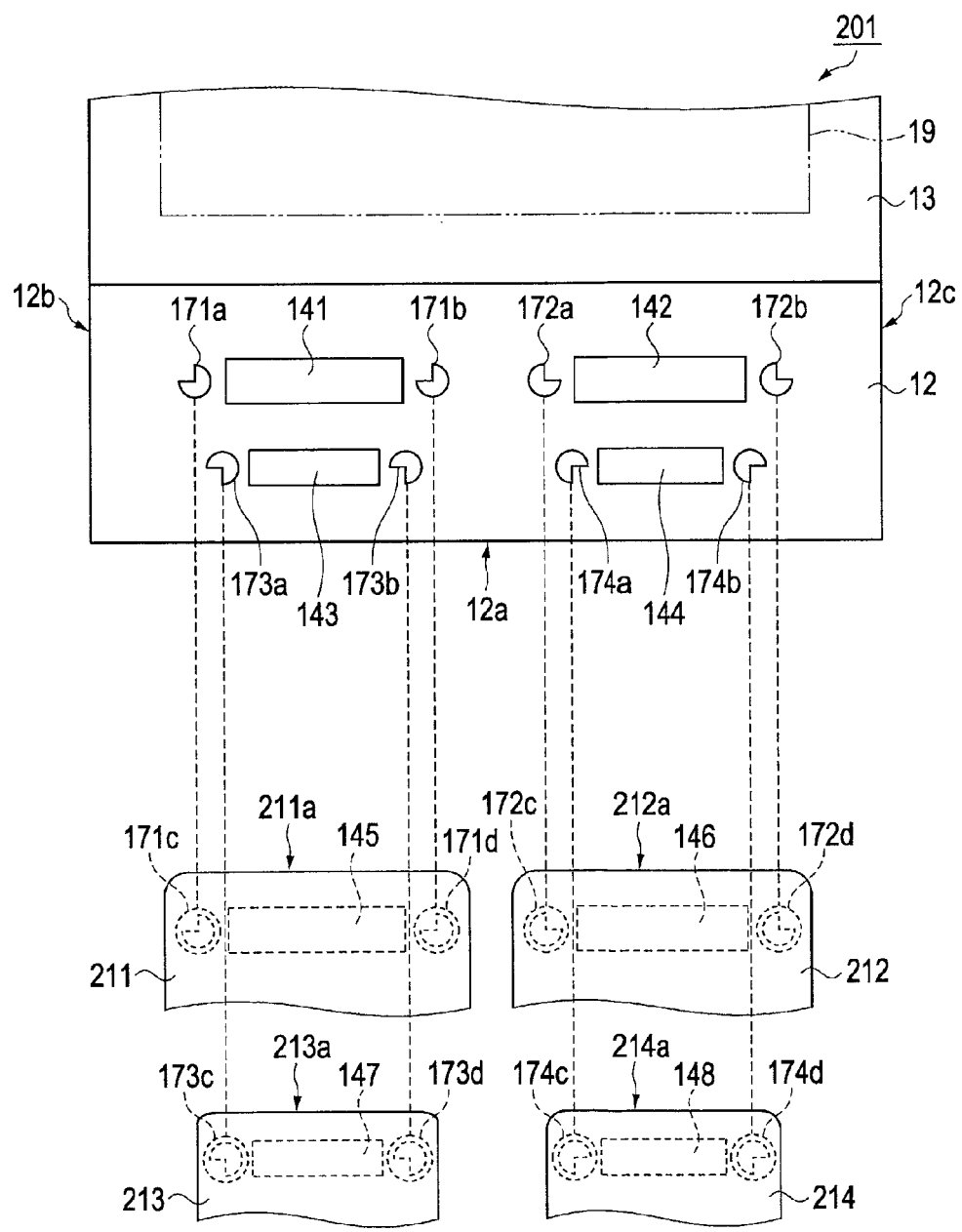
FIG. 10 is a exploded schematic view of the bonding portion of the liquid crystal panel and the circuit substrate.

FIG. 10 is an exploded schematic view of the bonding portion of the liquid crystal panel and the flexible substrate in the liquid crystal device. Hereafter, the structure of the liquid crystal device will be described with reference to FIG. 10.

As shown in FIG. 10, the first panel connection terminal portion 141 and the second panel connection terminal portion 142 are provided in parallel on the display region 19 side of the first side 12a of the element substrate 12 included in the liquid crystal panel 201. Further, the third panel connection terminal portion 143 and the fourth connection terminal portion 144 are provided in parallel in a direction apart from the display region 19 of the first side 12a.

The first panel alignment marks 171a and 171b are provided in both sides of the first panel connection terminal portion 141. The second panel alignment marks 172a and 172b are provided in both sides of the second panel connection terminal portion 142. The third panel alignment marks 173a and 173b are provided in both sides of the third panel connection terminal portion 143. The fourth panel alignment marks 174a and 174b are provided in both sides of the fourth panel connection terminal portion 144. These alignment marks 171a and 171b to 174a and 174b are formed simultaneously in the same process when the plurality of terminals constitutes the panel connection terminal portions 141 to 144, for example.

The two first panel alignment marks 171a and 171b have for example, shapes (concave shape) where a part of the circular shape is missing. Specifically, the positions of the first panel connection terminal portion 141 have circular shapes missing an upper left portion close to the display region 19 and the second side 12b.

The two second panel alignment marks 172a and 172b have for example, the positions of the second panel connection terminal portion 142 having circular shapes where an upper light portion close to the display region 19 and the third side 12c is missing. The two third panel alignment marks 173a and 173b have for example, the positions of the third panel connection terminal portion 143 having circular shapes where a lower left portion close to the first side 12a and the second side 12b is missing. The two fourth panel alignment marks 174a and 174b have for example, the positions of the fourth panel connection terminal portion 144 having circular shapes where a lower light portion close to the first side 12a and the third side 12c is missing.

Meanwhile, the first FPC connection terminal portion 145 connected to the first panel connection terminal portion 141 is provided in one end 211a side of the first flexible substrate 211 and the first FPC alignment marks 171c and 171d are provided in both sides of the first FPC connection terminal portion 145. The second FPC connection terminal portion 146 connected to the second panel connection terminal portion 142 is provided in one end 212a side of the second flexible substrate 212 and the second FPC alignment marks 172c and 172d are provided in both sides of the second FPC connection terminal portion 146. The third FPC connection terminal portion 147 connected to the third panel connection terminal portion 143 is provided in one end 213a side of the third flexible substrate 213 and the third FPC alignment marks 173c and 173d are provided in both sides of the third FPC connection terminal portion 147. The fourth FPC connection terminal portion 148 connected to the fourth panel connection terminal portion 144 is provided in one end 214a side of the fourth flexible substrate 214 and the fourth FPC alignment marks 174c and 174d are provided in both sides of the fourth FPC connection terminal portion 148.

These alignment marks 171c and 171d to 174c and 174d are formed simultaneously in the same process when the plurality of terminals includes the FPC connection terminal portions 145 to 148, for example.

The first FPC alignment marks 171c and 171d have opened shapes in the circular shapes depending on the external shapes of the first panel alignment marks 171a and 171b formed on the element substrate 12 side. The second FPC alignment marks 172c and 172d have opened shapes in the circular shapes depending on the external shapes of the second panel alignment marks 172a and 172b. The third FPC alignment marks 173c and 173d have opened shapes in the circular shapes depending on the external shapes of the third panel alignment marks 173a and 173b. The fourth FPC alignment marks 174c and 174d have opened shapes in the circular shapes depending on the external shapes of the fourth panel alignment marks 174a and 174b.

That is, if the open shapes of the first FPC alignment marks 171c and 171d are overlapped to the external shapes of the first panel alignment marks 171a and 171b, the shapes are aligned. In the same manner, the shapes of the second FPC alignment marks 172c and 172d and the second panel alignment marks 172a and 172b, the third FPC alignment marks 173c and 173d and the third panel alignment marks 173a and 173b, and the fourth FPC alignment marks 174c and 174d and the fourth panel alignment marks 174a and 174b are aligned.

As such, by making the shapes of the alignment marks 171 to 174 of the first flexible substrate 211 to the fourth flexible substrate 214 different, it is possible to correctly align the connection positions of the flexible substrates 211 to 214 even when a plurality of the flexible substrates 211 to 214 are bonded to the liquid crystal panel 201.

Also, because the shape of each alignment mark 171 to 174 is a shape including an arc shape, it is easily possible to find the centroid of the shape of each of the alignment marks 171 to 174 to improve the position alignment precision.

As described above, the below effects are obtained according to the second embodiment in addition to the effects (1) and (2) of the first embodiment described above.

(3) According to the second embodiment, positions where the panel connection terminal portions 141 to 144 in the external connection terminal forming-region 14 (refer to FIG. 1) of the liquid crystal panel 201 are disposed correspond to positions where the flexible substrates 145 to 148 can be bonded, and for example, the alignment marks 171 to 174 have shapes having a missing part in the arrangement direction, so that when a plurality of the flexible substrates 211 to 214 are aligned to the liquid crystal panel 201, the bonding position errors can be prevented. Also, because the shapes of alignment marks 171 to 174 are shapes including an arc shape, it is easily possible to find the centroids thereof to improve the position alignment precision.

Third Embodiment

Configuration of Electronic Apparatus

Figure 11:
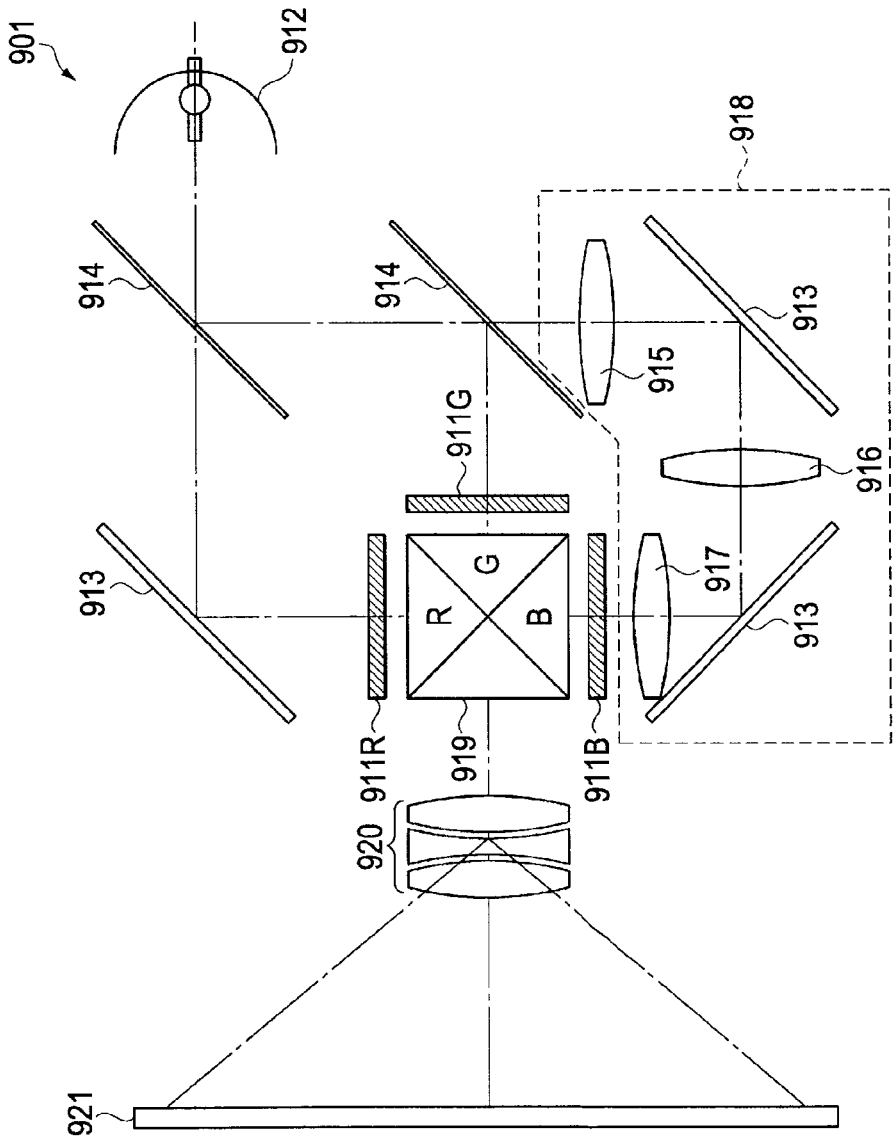
FIG. 11 is a schematic view illustrating a configuration of a liquid crystal projector as one example of an electronic apparatus.

FIG. 11 is a schematic view illustrating a configuration of a liquid crystal projector as one example of an electronic apparatus including the liquid crystal device as described above. Hereafter, the configuration of the liquid crystal projector including the liquid crystal device will be described with reference to FIG. 11.

As shown in FIG. 11, the liquid crystal projector 901 has a structure where three liquid crystal modules adopting any one of the above described liquid crystal devices 100 and 200 are disposed, and used as a light valves 911R, 911G, and 911B for respective RGB.

In detail, a projection light from a lamp unit 912 including a white light source such as a metal hydro-ramp is emitted, and then divided into the light components R, G and B corresponding to the three primary colors of R, G and B by three mirrors 913 and two dichroic mirrors 914, and thereafter is guided to light valves 911R, 911G, and 911B corresponding to the colors, respectively. In particular, the light component B is guided through the relay lens system 918 made of an incident lens 915, a relay lens 916, and an output lens 917 in order to prevent the loss of the light due to the long light path.

The light components R, G and B corresponding to the three primary colors modulated by the light valve 911R, 911G and 911B respectively are re-synthesized by the dichroic prism 919, and thereafter are projected to a screen 921 as a color image through a projection lens 920.

This configuration of the liquid crystal projector 901 can perform high quality display by interposing the liquid crystal modules adopting any one of the above described liquid crystal devices 100 and 200. Furthermore, the above described liquid crystal devices 100 and 200 are applicable to not only the liquid crystal projector 901 but also various electronic apparatuses such as a high precision EVF (Electric View Finder), a mobile phone, a mobile computer, a digital camera, a digital video camera, a television, an on-vehicle apparatus, and an audio apparatus.

As described above, the below effects are obtained according to the third embodiment.

(4) According to the third embodiment, by including the liquid crystal devices of the above described first embodiment and second embodiment, it is possible to provide an electronic apparatus which is highly reliable in terms of electrical characteristics.

Furthermore, the embodiments are not limited to the above embodiments, and can be implemented in the following modifications.

Modified Example 1

As described above, the shapes of the alignment marks 71, 72 and 171 to 174 are not limited to the fan-shape according to the first embodiment or the notched circular shape according to the second embodiment, and may have shapes as shown in FIGS. 12 to 15, for example. FIGS. 12 to 15 are enlarged plan views schematically illustrating the connection portions of the liquid crystal panel and the first flexible substrate to the fourth flexible substrate in the case of bonding the four flexible substrates to the liquid crystal panel, for example.

Figure 12:
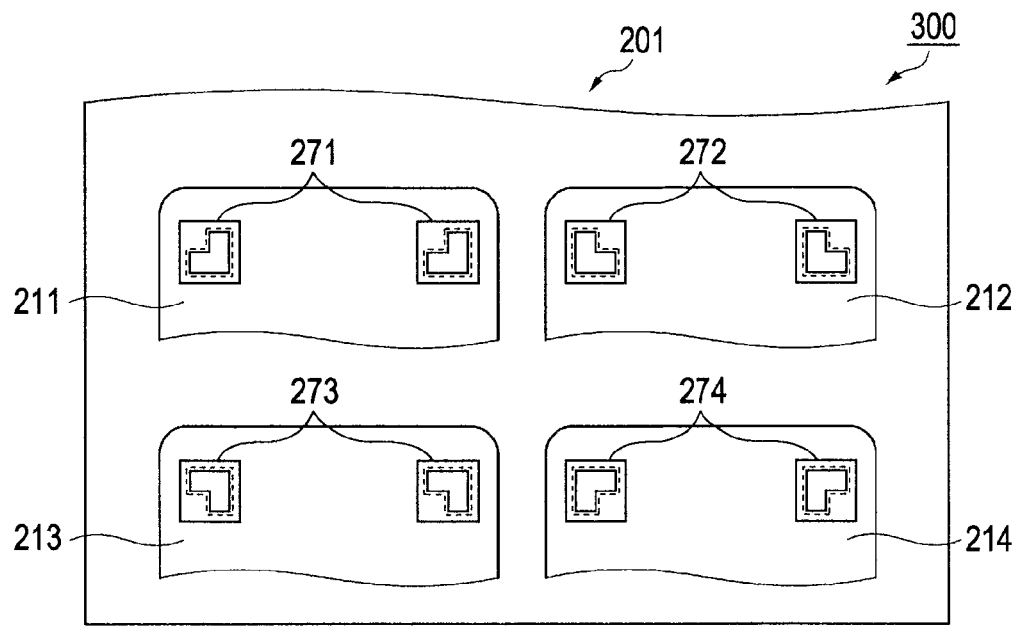
FIG. 12 is a schematic plan view illustrating a configuration of an alignment mark of a modified example.

The alignment marks 271 to 274 of the liquid crystal device 300 shown in FIG. 12 have shapes (concave shapes) where a part of the rectangular shapes is missing. For example, the alignment mark 271 of the first flexible substrate 211 has a shape where the upper left corner among the four corners of the rectangle is missing. The alignment mark 272 of the second flexible substrate 212 has a shape where the upper right corner among the four corners of the rectangle is missing. The alignment mark 273 of the third flexible substrate 213 has a shape where the lower left corner among the four corners of the rectangle is missing. The alignment mark 274 of the fourth flexible substrate 214 has a shape where the lower right corner among the four corners of the rectangle is missing. As such, by making the shapes of the alignment marks 271 to 274 different, it is possible to prevent the bonding error of the four flexible substrates 211 to 214.

Figure 13:
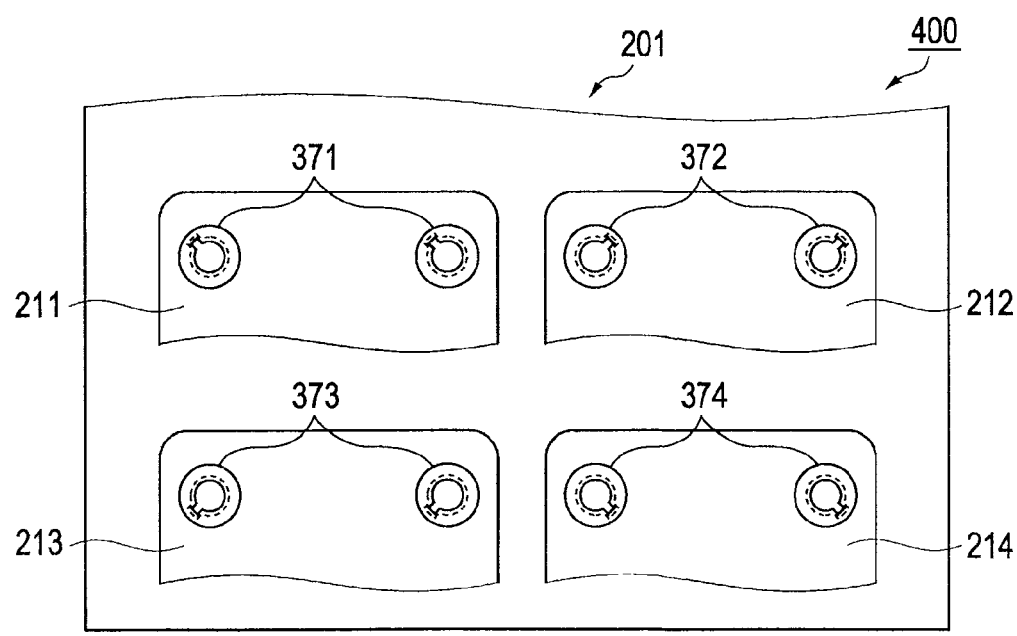
FIG. 13 is a schematic plan view illustrating a configuration of an alignment mark of a modified example.

Also, the alignment marks 371 to 374 of the liquid crystal device 400 shown in FIG. 13 have shapes where a protrusion (convex shape) is formed in a direction of a part of the circular shapes. By changing the position of the protrusion for each of the four connection portions, it is possible to prevent the bonding error of the four flexible substrates 211 to 214.

Figure 14:
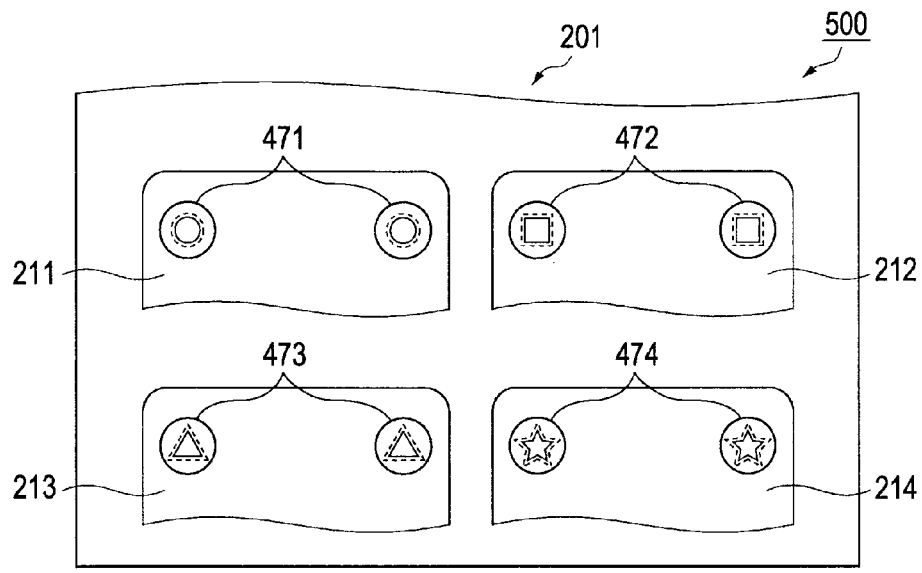
FIG. 14 is a schematic plan view illustrating a configuration of an alignment mark of a modified example.

Also, the alignment marks 471 to 474 of the liquid crystal device 500 shown in FIG. 14 are not distinguished as the symmetric shapes such as notch positions due to the bonding positions of the flexible substrates 211 to 214, but are distinguished as completely different shapes. The alignment mark 471 of the first flexible substrate 211 has a circular shape. The alignment mark 472 of the second flexible substrate 212 has a rectangular shape. The alignment mark 473 of the third flexible substrate 213 has a triangle shape. The alignment mark 474 of the fourth flexible substrate 214 has a star shape. As such, by making the respective shapes different, it is possible to prevent the bonding error of the four flexible substrates 211 to 214.

Figure 15:
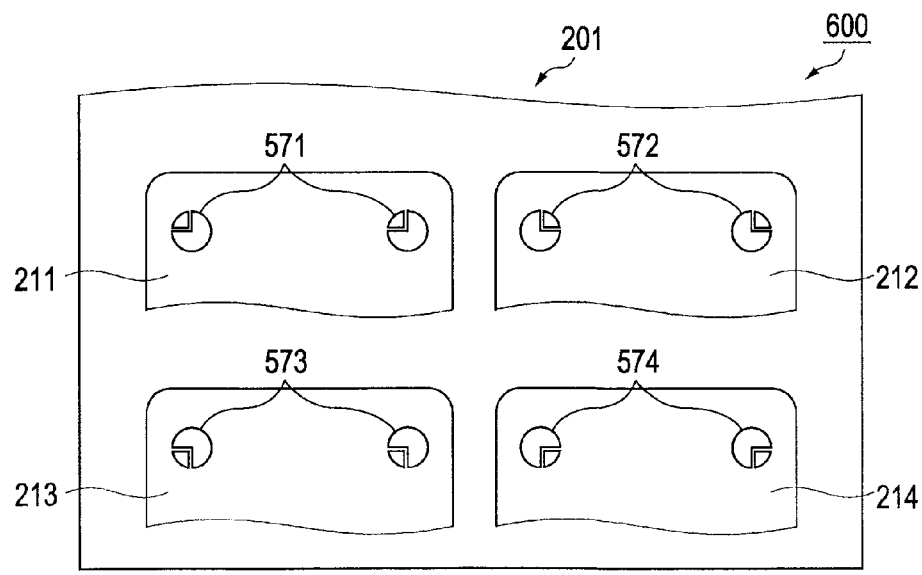
FIG. 15 is a schematic plan view illustrating a configuration of an alignment mark of a modified example.

Also, the alignment marks 571 to 574 of the liquid crystal device 600 shown in FIG. 15 are set to be circular shapes as predetermined shapes by aligning (incorporating) the shapes of the panel alignment marks and the shapes of the FPC alignment marks. Furthermore, the shapes of the panel alignment marks have the same as the second embodiment. By making these alignment marks, it is possible to correctly connect the bonding position of the flexible substrates to the liquid crystal panel 101.

Modified Example 2

As described above, the invention is not limited to the alignment by providing two alignment marks with respect to the one flexible substrate and, for example, may perform alignment by providing two or more alignment marks.

Modified Example 3

As described above, the driving IC chip 102 is mounted to the flexible substrates 111, 112 and 211 to 214 (COF: Chip On Film), but the flexible substrates to which the driving IC chip 102 is not mounted may be used.

Modified Example 4

As described above, as one example of the electronic apparatus, the liquid crystal projector 901 has been described; however, the invention is not limited thereto, and is applicable to various electronic apparatuses such as a high precision EVF (Electric View Finder), a mobile phone, a mobile computer, a digital camera, a digital video camera, a television, an on-vehicle apparatus, and an audio apparatus. Also, the invention is not limited to the liquid crystal device 100 and 200, and is applicable to for example, an organic EL device, a plasma display, or the like.

The entire disclosure of Japanese Patent Application No. 2009-265996, filed Nov. 24, 2009 is expressly incorporated by reference herein.

What is claimed is:

1. An electro-optical device comprising:
    an electro-optical panel including:
        a first terminal portion on which a plurality of terminals are arranged in a predetermined direction;
        a pair of first panel alignment marks having a first shape provided in both end sides for the predetermined direction of the first terminal portion
        a second terminal portion on which a plurality of terminals are arranged in the predetermined direction; and
        a pair of second panel alignment marks having a second shape provided in both end sides for the predetermined direction of the second terminal portion, the second shape being different from the first shape in a direction of a characteristic portion thereof or being different from the first shape in a shape thereof; and
    a first circuit substrate provided with a first connection terminal portion electrically connected to the first terminal portion, the first circuit substrate being provided with a first circuit substrate alignment mark which is represented by the first shape in plan view, which is not overlapped each other upon superimposing the first panel alignment mark in a reference position, and which is set as the predetermined shape in a shape upon incorporation; and
    a second circuit substrate provided with a second connection terminal portion electrically connected to the second terminal portion, the second circuit substrate being provided with a second circuit substrate alignment mark which is represented by the second shape in plan view, which is not overlapped each other upon superimposing the second panel alignment mark in a reference position, and which is set as the predetermined shape in a shape upon incorporation.

2. The electro-optical device according to claim 1,
    wherein the direction of the characteristic portion is a direction indicating a relative arrangement relationship of the first terminal portion and the second terminal portion for the electro-optical panel.

3. The electro-optical device according to claim 1,
    wherein the shape of the characteristic portion is a convex shape or a concave shape.

4. The electro-optical device according to claim 1,
    wherein a distance between the pair of the first panel alignment marks and a distance between the pair of the second panel alignment marks are substantially equal.

5. The electro-optical device according to claim 1,
    wherein the first circuit substrate alignment mark is represented by the first shape in plan view and is formed to surround the first shape, and
    the second circuit substrate alignment mark is represented by the second shape in plan view and is formed to surround the second shape.

6. The electro-optical device according to claim 5,
    wherein the electro-optical device has a uniform gap over the entire circumferences of the first shape and the second shape upon aligning the first panel alignment mark and the first circuit substrate alignment mark, and the second panel alignment mark and the second circuit substrate alignment mark.

7. The electro-optical device according to claim 1,
    wherein an arc shape is included in a part of the first shape and the second shape.

8. An electronic apparatus comprising the electro-optical device according to claim 1.

* * * * *